United States Patent [19]
Iwanami

[11] Patent Number: 5,760,441
[45] Date of Patent: Jun. 2, 1998

[54] METAL OXIDE SEMICONDUCTOR DEVICE

[75] Inventor: Eiichi Iwanami, Tateyama, Japan

[73] Assignee: Nippon Steel Semiconductor Corporation, Tateyama, Japan

[21] Appl. No.: 738,419

[22] Filed: Oct. 25, 1996

Related U.S. Application Data

[62] Division of Ser. No. 644,447, May 13, 1996, Pat. No. 5,641,697.

[30] Foreign Application Priority Data

May 16, 1995 [JP] Japan ................................. 7-141079

[51] Int. Cl.$^6$ ............... H01L 29/76; H01L 29/94; H01L 31/062; H01L 31/113
[52] U.S. Cl. .............................. 257/345; 257/409
[58] Field of Search ............................ 257/345, 409

[56] References Cited

U.S. PATENT DOCUMENTS

| | | |
|---|---|---|
| 4,602,267 | 7/1986 | Shirato . |
| 4,692,781 | 9/1987 | Rountree et al. . |
| 4,893,157 | 1/1990 | Miyazawa et al. . |
| 4,937,639 | 6/1990 | Yao et al. . |
| 5,027,252 | 6/1991 | Yamamura . |
| 5,158,899 | 10/1992 | Yamagata . |
| 5,183,773 | 2/1993 | Miyata . |
| 5,406,105 | 4/1995 | Lee . |
| 5,436,484 | 7/1995 | Iwai et al. . |
| 5,446,303 | 8/1995 | Quill et al. . |
| 5,449,939 | 9/1995 | Horiguchi et al. . |
| 5,449,940 | 9/1995 | Hirata . |
| 5,514,612 | 5/1996 | Rao et al. . |

FOREIGN PATENT DOCUMENTS

| | | |
|---|---|---|
| 2703877 | 8/1978 | Germany . |
| 54-121071 | 9/1979 | Japan . |
| 55-56663 | 4/1980 | Japan . |
| 3-6863 | 1/1991 | Japan . |

*Primary Examiner*—Stephen Meier
*Attorney, Agent, or Firm*—Holland & Hart LLP

[57] ABSTRACT

A p-type high concentration doped region is formed in a p-type semiconductor substrate between a n-type doped region as part of an input protection circuit and another n-type doped region as part of internal circuitry. A plate is divided into two over the high concentration doped region. The high concentration doped region suppresses generation of a parasitic MOS transistor with the plate for a gate, one of the n-type doped regions for a source, and the other for a drain.

2 Claims, 4 Drawing Sheets

METAL OXIDE SEMICONDUCTOR DEVICE

RELATED APPLICATION

The present application is a divisional application of U.S. patent application Ser. No. 08/644,447, filed May 13, 1996, now U.S. Pat. No. 5,641,697.

FIELD OF THE INVENTION

The present invention relates to a metal oxide semiconductor (MOS) device with an input protection circuit at a stage higher than the internal circuitry thereof. The invention particularly relates to a MOS device with a field isolation region between the internal circuity and the input protection circuit, wherein plates of a fixed potential suppress surface inversion of the semiconductor substrate.

BACKGROUND OF THE INVENTION

FIG. 1 is a schematic diagram of a conventional input protection circuit for a MOS device. The input protection circuit 300 comprises a resistor (R) 300A connected in series between an input terminal 100 and internal circuitry 200, and a MOS transistor 300B whose drain is connected to one end of the resistor 300A and whose source and gate are respectively connected to ground (Vss).

FIG. 2 is a cross-section profile including the resistor 300A, a connection C of the resistor 300A and the drain of the MOS transistor 300B and part of the internal circuitry 200.

An n-type doped region 2 and an n-type doped region 3 are formed respectively on the surface of a p-type semiconductor substrate 1, such as a silicon substrate. The n-type doped region 2 makes the drain of the MOS transistor 300B in FIG. 1. The n-type doped region 3 makes part of the internal circuitry 200. Plates 4a, 4b and 4c of polycrystalline silicon films are respectively formed on the p-type semiconductor substrate, isolated by an insulator 1a, such as a silicon dioxide film, in between. Each of the plates 4a, 4b and 4c is typically connected to a power source, such as ground (Vss), which makes a field isolation region between the input protection circuit 300 and the internal circuitry 200. As a result, the surface of the p-type substrate 1 directly beneath the plates 4a, 4b and 4c is prevented from inverting, and thus the n-type doped region 2 and the n-type doped region 3 are electrically isolated.

Over the plates 4a, 4b and 4c is an interlayer insulator 5, such as a silicon dioxide film which can be made by chemical vapor deposition. The interlayer insulator 5 isolates a polycrystalline silicon layer 6 formed directly above the plate 4a. The polycrystalline silicon layer 6 makes the resistor 300A. Each of the electrode wiring layers 7 and 8 of aluminum is electrically connected to the polycrystalline silicon layer 6 via contacts 7a and 9a of the interlayer insulator 5, respectively. The electrode wiring layer 8 is electrically connected to the n-type doped region 2 via the contact 8b of the interlayer insulator 5. To the n-type doped region 3 for the internal circuitry 200, an electrode wiring layer 9 which is of aluminum, too, is electrically connected via contact 9a of the interlayer insulator 5.

The conventional input protection circuit 300 with the structure described above may not have any problem when used in a system with a supply voltage of 5 V wherein the voltage inputted is usually 0 to 5 V. However, the problem described below may result when the circuit is used in a system where an abnormal current may occur such as the one shown in FIG. 3, that is, a big undershooting of an input waveform (Vin) becoming lower than the ground potential (Vss=0).

FIG. 4 shows the relationship between the input current and the input voltage applied to the input terminal 100 shown in FIG. 1. As shown in FIG. 4, a negative input current increases when the input voltage (Vin) becomes lower than the ground potential (Vss=0) This is due to a parasitic MOS transistor 10 shown in FIG. 2, formed with the n-type doped region 2 for a source, the n-typed doped region 3 for a drain and the plate 4b for a gate thereof. On application of a voltage exceeding the threshold voltage (Vth) of the parasitic MOS transistor 10, which is typically 2 to 10 V, the parasitic MOS transistor 10 turns on to pass a current between the n-type doped regions 2 and 3. The current makes the n-typed doped region 3, part of the internal circuitry 200, change to a negative because of the negative applied voltage. Thus, malfunctions result.

The present invention serves to solve the problem described above. It is an object of the invention to provide a MOS device and the method of manufacturing the same, to suppress generation of a parasitic MOS transistor and thereby to prevent malfunctions due to abnormal currents without any additional step of manufacturing process.

SUMMARY OF THE INVENTION

Figure 1:
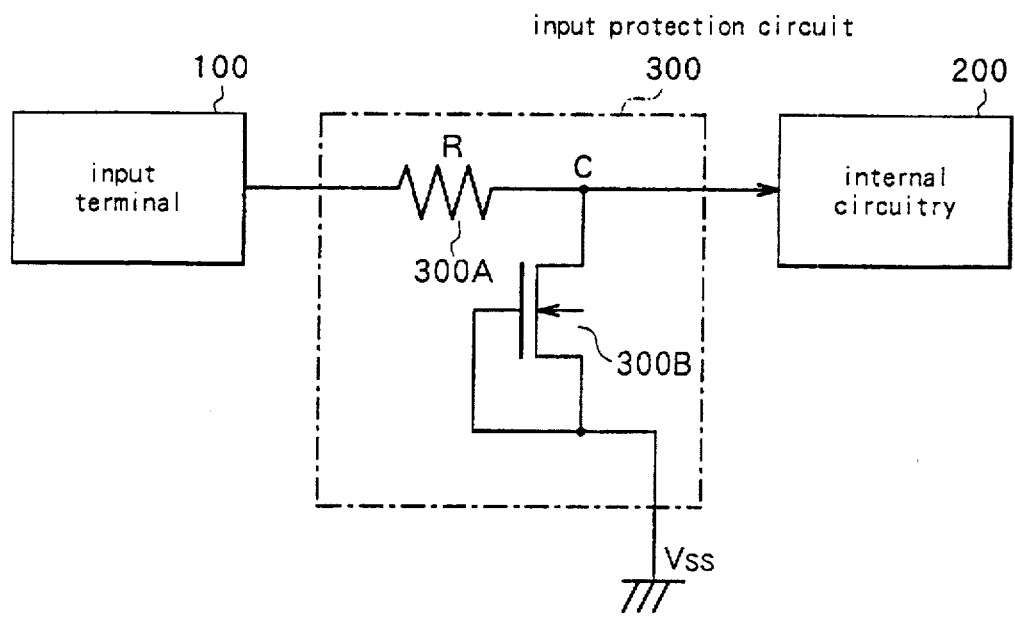
FIG. 1 is a schematic diagram of an input protection circuit for a MOS device.

The present invention provides a MOS device with an input protection circuit at a stage higher than the internal circuitry thereof. The MOS device of the invention comprises: a) a first doped region whose conductivity type is opposite to that of a semiconductor substrate in the surface of which the first doped region is formed as part of the input protection circuit; b) a second doped region whose conductivity type is opposite to that of a semiconductor substrate in the surface of which the second doped region is formed as part of the internal circuitry; c) a plate formed via an insulator in the area of the semiconductor substrate, at least, between the first and second doped regions, whose potential is fixed, which suppresses surface inversion of the semiconductor substrate; and d) a high concentration doped region whose conductivity type is the same as that of the semiconductor substrate in which the high concentration doped region is formed between the first and second doped regions.

The MOS device of the present invention has a high concentration doped region whose conductivity type is the same as the semiconductor substrate in which the high concentration doped region is formed between the first doped region as part of the input protection circuit and the second doped region as part of the internal circuitry. As a result, generation of a parasitic MOS transistor is suppressed, with the plate for a gate, the first doped region for a source and the second doped region for a drain thereof.

A current inputted via a parasitic MOS transistor is thus significantly decreased, and thereby malfunctions are prevented. Hence, the invention provides a MOS device which allows semiconductor users to configure a system with much fewer restrictions.

In the MOS device of the invention, it is preferable that the plate is divided over the high concentration doped region.

In the MOS device of the invention, the high concentration doped region may surround the first doped region in one plane to ensure that generation of a parasitic MOS transistor is suppressed.

The method of manufacturing the MOS device of the invention includes the following steps: a) a step of selectively applying a dopant to the surface of a semiconductor substrate, wherein the conductivity type of the dopant is opposite to that of the semiconductor substrate, to form the first doped region as part of the input protection circuit and the second doped region as part of the internal circuitry, respectively; b) a step of applying a dopant to the area between the first and second doped regions of a semiconductor substrate, wherein the conductivity type of the dopant is the same as the substrate, to form the high concentration doped region at the same step as one of the manufacturing steps of the internal circuitry; and c) a step of forming an insulation layer in the area at least between the first and second doped regions over the semiconductor substrate and forming a plate over the insulation layer, whose potential is fixed, for suppressing surface inversion of the semiconductor substrate.

Hence, the method of manufacturing the MOS device of the invention is to form the high concentration doped region between the first and second doped regions at the same step as one of the steps of manufacturing the internal circuitry. Therefore, the MOS device of the invention is implemented without any additional manufacturing step to the prior process.

DETAILED DESCRIPTION

Preferred embodiments of the invention will now be described in detail with reference to the accompanying drawings.

Figure 2:
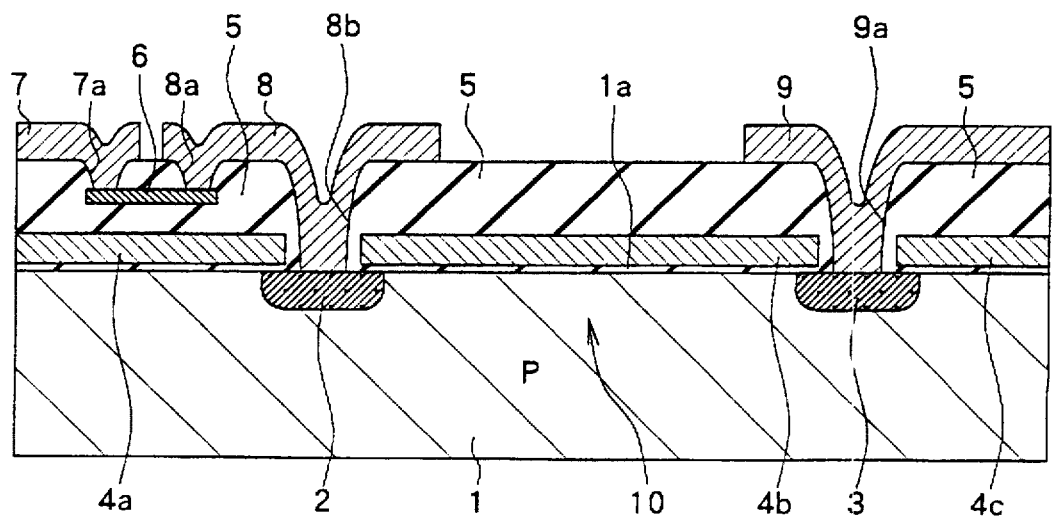
FIG. 2 is a cross-sectional profile showing a conventional MOS device.
Figure 5:
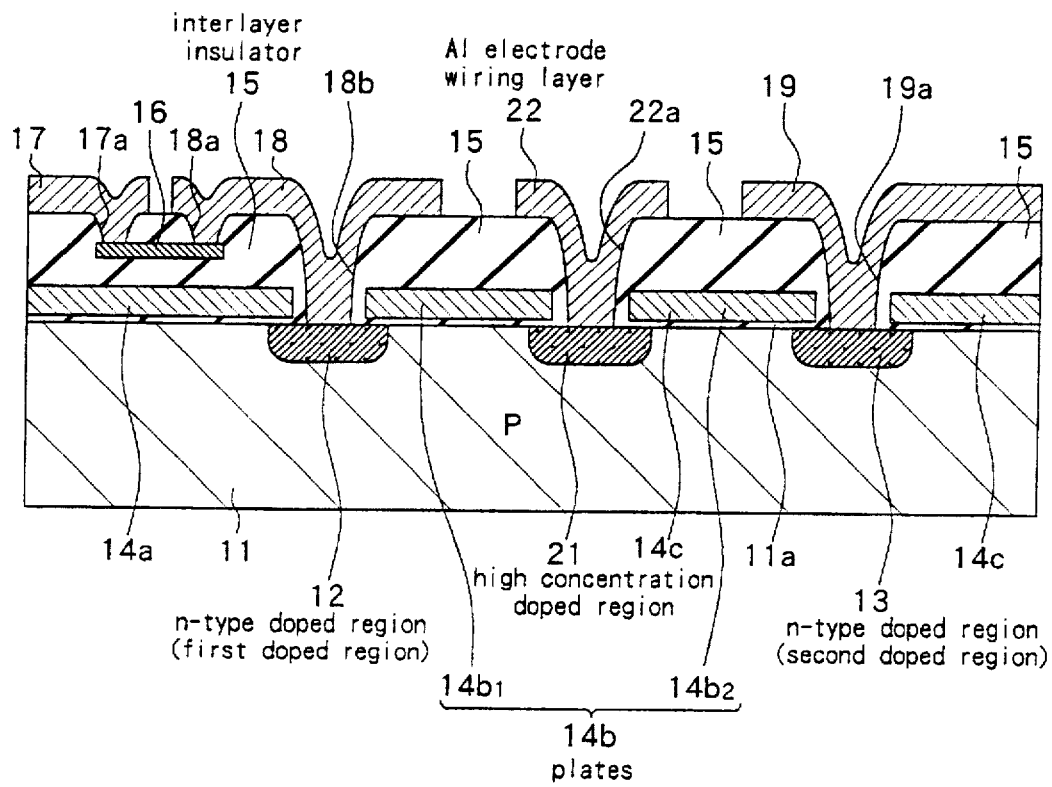
FIG. 5 is a cross-sectional profile showing a MOS device according to a preferred embodiment of the invention.
Figure 6:
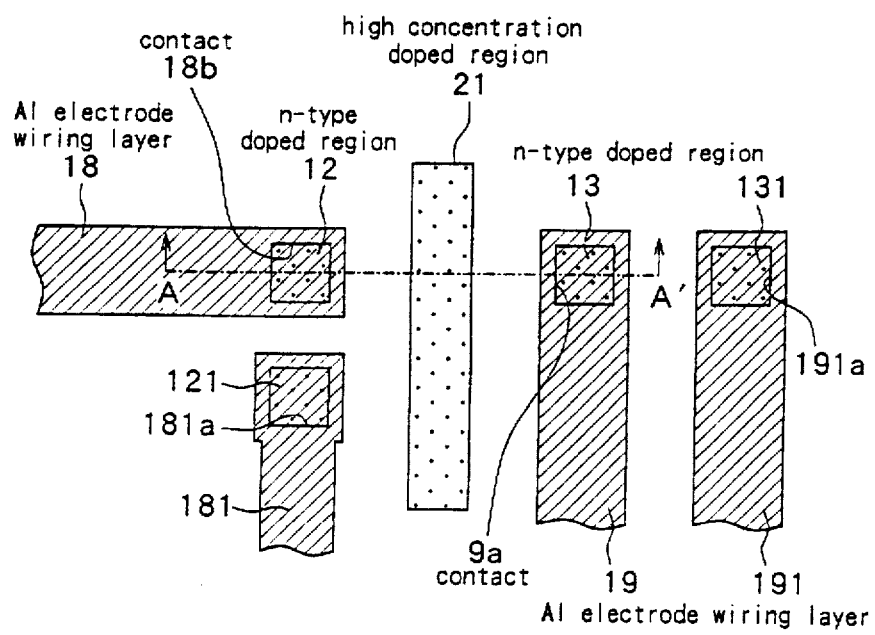
FIG. 6 is a top view of the elements of the MOS device of FIG. 5.

FIG. 6 is a top view of the MOS device according to a preferred embodiment of the invention. FIG. 5 is a cross-sectional view of FIG. 6 taken along line A—A'. FIG. 5 is a cross-sectional profile of the elements shown in FIG. 1, including the resistor 300A of the input protection circuit 300, the connection C of the resistor 300A and the drain of the MOS transistor 300B, and part of the internal circuitry 200, which is the same as FIG. 2.

In FIGS. 5 and 6, n-type doped regions 12 and 121 as the first doped region and n-type doped regions 13 and 131 as the second doped region are formed respectively in the surface of a p-type semiconductor substrate, such as a silicon substrate. The n-typed doped regions 12 and 121 make the drain of the MOS transistor 300B shown in FIG. 1. The n-type doped regions 13 and 131 make part of the internal circuitry 200. The concentration of the n-typed doped regions 12 and 121 is $5\times10^{19}$ to $3\times10^{21}$ atoms/cm$^3$ and that of the n-type doped regions 13 and 131 is the same. Insulators 11a, such as silicon dioxide films, are formed over the p-type semiconductor substrate 11. Plates 14a, 14b and 14c of polycrystalline silicon films are formed respectively over the insulators 11a. Each of the plates 14a, 14b and 14c is connected to a power source, such as ground (Vss). As a result, surface inversion of the p-type semiconductor substrate 11 directly beneath the plates 14a, 14b and 14c is suppressed, and thus the n-type doped regions 12 and 13 are electrically isolated.

A polycrystalline silicon layer 16 is formed directly above the plate 14a which is isolated by an interlayer insulator 15 made of a silicon dioxide film and the like, which may be formed by chemical vapor deposition. The polycrystalline silicon layer 16 makes the resistor 300A shown in FIG. 1. Electrode wiring layers 17 and 18 of aluminum are electrically connected to the polycrystalline silicon layer 16 via contacts 17a and 18a formed in the interlayer insulator 15. The electrode wiring layer 18 is electrically connected to the n-type doped region 12 via a contact 18b in the interlayer insulator 15. An electrode wiring layer 181 is connected to the n-type doped region 121 via a contact 181a. To the n-type doped region 13 for the internal circuitry 200, an electrode wiring layer 19 of aluminum as well is electrically connected via a contact 19a in the interlayer insulator 15. An electrode wiring layer 191 is electrically connected to the n-type doped region 131 via a contact 191a.

While the structure of the MOS device of the preferred embodiment described above includes conventional features, the improved MOS device of the invention has unique features described hereinafter. That is, a high concentration doped region 21 is formed, whose conductivity type is the same as the p-type semiconductor substrate 11 in which the high concentration doped region 21 is formed, between the n-type doped regions 12 and 121 and the n-type doped regions 13 and 131. The concentration of the high concentration doped region 21 is $1\times10^{18}$ to $1\times10^{21}$ atoms/cmp$^3$. The plate 14b is divided into two, the plates 14b$_1$, and 14b$_2$, over the high concentration doped region 21.

An electrode wiring layer 22 is electrically connected to the high concentration doped region 21 via a contact 22a in the interlayer insulator 15 between the plates 14b$_1$ and 14b$_2$. The electrode wiring layer 22 is connected such that the electric potential thereof is the same as the p-type semiconductor substrate 11. The electrode wiring layer 22 is not necessarily required since the high concentration p-type region 21 is automatically of the same potential as the p-type semiconductor substrate 11 without the electrode wiring layer 22.

Figure 3:
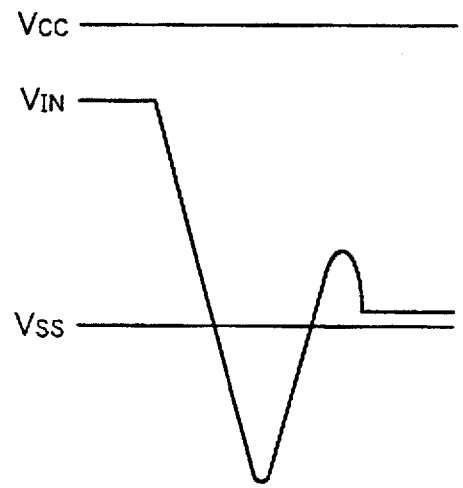
FIG. 3 is a graph showing a waveform for describing an abnormal current.
Figure 4:
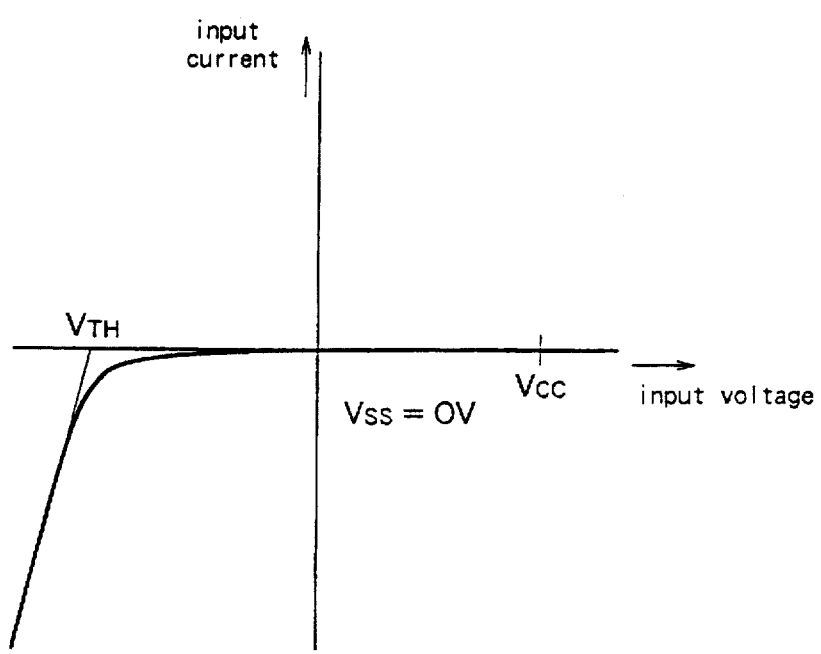
FIG. 4 is a graph showing the relationship between the current and the voltage for the input protection circuit.

Hence, in the MOS device of the preferred embodiment, the high concentration doped region 21 is formed, whose conductivity type is the same as the p-type semiconductor substrate 11, between the n-type doped regions 12 and 121 as the first doped region and the n-type doped regions 13 and 131 as the second doped region. The n-type doped regions 12 and 121 make part of the input protection circuit 300, and the n-type doped regions 13 and 131 make part of the internal circuitry 200. As a result, the high concentration doped region 21 suppresses generation of a parasitic MOS transistor with the plate for a gate, the n-type doped regions 12 and 121 for a source, and the n-type doped regions 13 and 131 for a drain. Therefore, as previously described with reference to FIG. 3, when an abnormal signal (a negative undershooting) occurs whose input waveform (Vin) goes lower than the ground potential (Vss=0), a current inputted via a parasitic MOS transistor will be significantly decreased, which prevents malfunctions.

It is another feature of the invention that the high concentration doped region 21 is formed at the same step of manufacturing process as selectively forming the high concentration p-type dope regions for electrodes of the substrate, the source and drain of p-channel MOS transistors in the internal circuitry 200. Hence, the structure of the MOS device of the invention described above is implemented without adding any particular step to the prior manufacturing process, and the device of the invention is thus easily manufactured.

Figure 7:
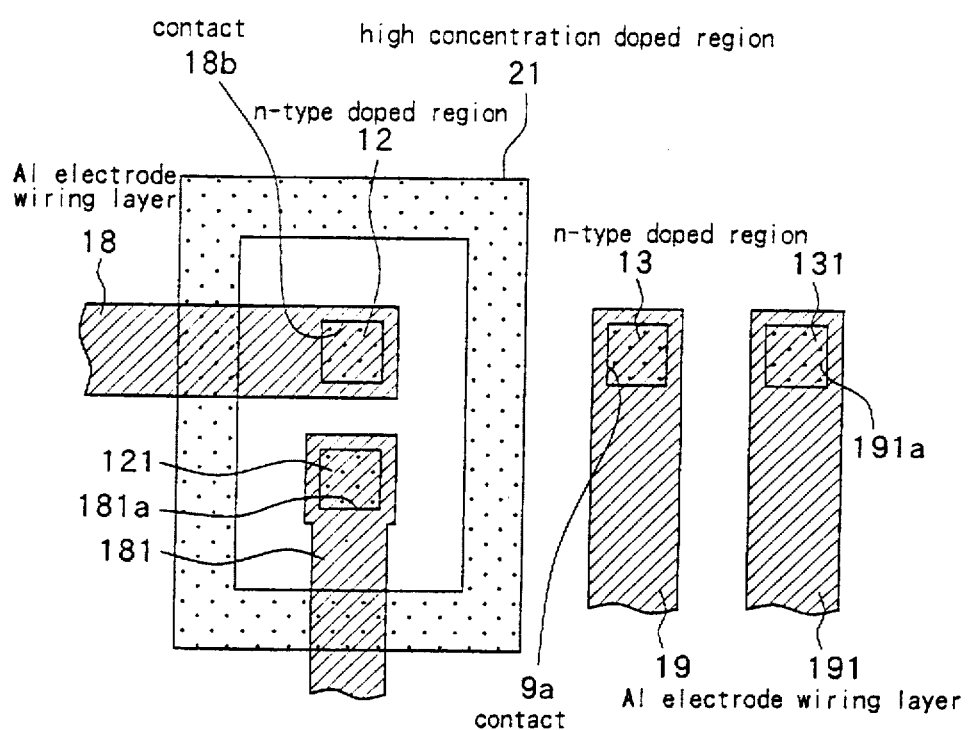
FIG. 7 is a top view of the elements of the MOS device of another embodiment of the invention.

FIG. 7 shows the configuration of another embodiment of the present invention, wherein the high concentration doped region 21 of the embodiment described above completely surrounds the n-type doped regions 12 and 121 as part of the input protection circuit 300 in one plane. The rest of the configuration is the same as the embodiment described above and the description thereof is omitted here.

The high concentration doped region 21 completely surrounds the n-type doped regions 12 and 121 in the embodiment, which suppresses generation of a parasitic MOS transistor with the plate for a gate, the n-type doped regions 12 and 121 for a source, and the n-type doped regions 13 and 131 for a drain. As a result, prevention of malfunctions is ensured. While the high concentration doped region 21 surrounds the n-type doped regions 12 and 121 completely in FIG. 7, the n-typed doped regions are not necessarily surrounded completely as long as generation of a parasitic MOS transistor is suppressed.

The invention is not limited to the embodiments described above, but may be practiced in specific forms other than the embodiments without departing from the essential characteristics of the invention. In the preferred embodiments the input protection circuit 300 is the n-type doped region where a negative undershooting occurs as an abnormal current. The invention is applicable when the input protection circuit 300 is a p-type doped region where a positive overshooting occurs, by reversing the conductivity types of the semiconductor regions of the preferred embodiments.

What is claimed is:

1. A metal oxide semiconductor (MOS) device with an input protection circuit at a stage higher than internal circuitry thereof, comprising:

a) a first doped region as part of said input protection circuit, whose conductivity type is opposite to that of a semiconductor substrate on the surface of which said first doped region is formed;

b) a second doped region as part of said internal circuitry, whose conductivity type is opposite to that of said semiconductor substrate on the surface of which said second doped region is formed;

c) a plate formed over said semiconductor substrate in an area at least between said first and second doped regions, isolated by an insulator between said plate and said semiconductor substrate, whose potential is fixed, for suppressing surface inversion of said semiconductor substrate; and d) a high concentration doped region of the same conductivity type as said semiconductor substrate in which said high concentration doped region is formed in the area between said first and second doped regions apart from the first doped region and the second doped region, wherein said high concentration doped region surrounds said first doped region in one plane.

2. A metal oxide semiconductor (MOS) device with an input protection circuit at a stage higher than internal circuitry thereof, comprising:

a) a first doped region as part of said input protection circuit, whose conductivity type is opposite to that of a semiconductor substrate on the surface of which said first doped region is formed;

b) a second doped region as part of said internal circuitry, whose conductivity type is opposite to that of said semiconductor substrate on the surface of which said second doped region is formed;

c) a plate formed over said semiconductor substrate in an area at least between said first and second doped regions, isolated by an insulator between said plate and said semiconductor substrate, whose potential is fixed, for suppressing surface inversion of said semiconductor substrate; and d) a high concentration doped region of the same conductivity type as said semiconductor substrate in which said high concentration doped region is formed in the area between said first and second doped regions apart from the first doped region and the second doped region, wherein said plate is divided over said high concentration doped region and wherein said high concentration doped region surrounds said first doped region in one plane.

* * * * *